(12) United States Patent
Lin

(10) Patent No.: US 6,866,398 B2
(45) Date of Patent: Mar. 15, 2005

(54) FLEXIBE ROD LIGHT DEVICE FORMED OF CHIP ON BOARD BASED LED LAMPS AND MANUFACTURING METHOD THEREOF

(76) Inventor: Yuan Lin, 5 Viewmont Court, Doncaster East, 3109 VIC. (AU)

( * ) Notice: Subject to any disclaimer, the term of this patent is extended or adjusted under 35 U.S.C. 154(b) by 22 days.

(21) Appl. No.: 10/304,739

(22) Filed: Nov. 27, 2002

(65) Prior Publication Data

US 2003/0193803 A1 Oct. 16, 2003

(30) Foreign Application Priority Data

Apr. 16, 2002 (TW) ........................................ 91107788 A

(51) Int. Cl.$^7$ ................................................ F21S 4/00
(52) U.S. Cl. ........................ 362/250; 362/244; 362/800
(58) Field of Search ................................ 362/240, 244, 362/246, 249, 250, 251, 800

(56) References Cited

U.S. PATENT DOCUMENTS

| | | | | |
|---|---|---|---|---|
| 4,439,818 A | * | 3/1984 | Scheib | 362/250 |
| 5,410,459 A | * | 4/1995 | Yang | 362/249 |
| 5,927,845 A | * | 7/1999 | Gustafson et al. | 362/800 |
| 6,158,882 A | * | 12/2000 | Bischoff | 362/800 |
| 6,682,205 B2 | * | 1/2004 | Lin | 362/249 |

* cited by examiner

Primary Examiner—Y. My Quach-Lee
(74) Attorney, Agent, or Firm—Troxell Law Office, PLLC

(57) ABSTRACT

Flexible rod light device containing a string of chip on board (C.O.B.) based LED lamps and manufacturing method thereof are disclosed. The device comprises an inner layer including two parallel upward flanges on sides and a lengthwise top groove between the flanges; a string of C.O.B. based LED lamps comprising a plurality of series connected units each including a C.O.B. based LED lamp secured on the groove and between the flange, one or more conductor means, and a resistor; a pair of main wires parallel disposed within the flanges; and a jacket wrapped up the inner layer and the string of lamps. All lamps are secured and have the same orientation for achieving an increased illumination.

20 Claims, 11 Drawing Sheets

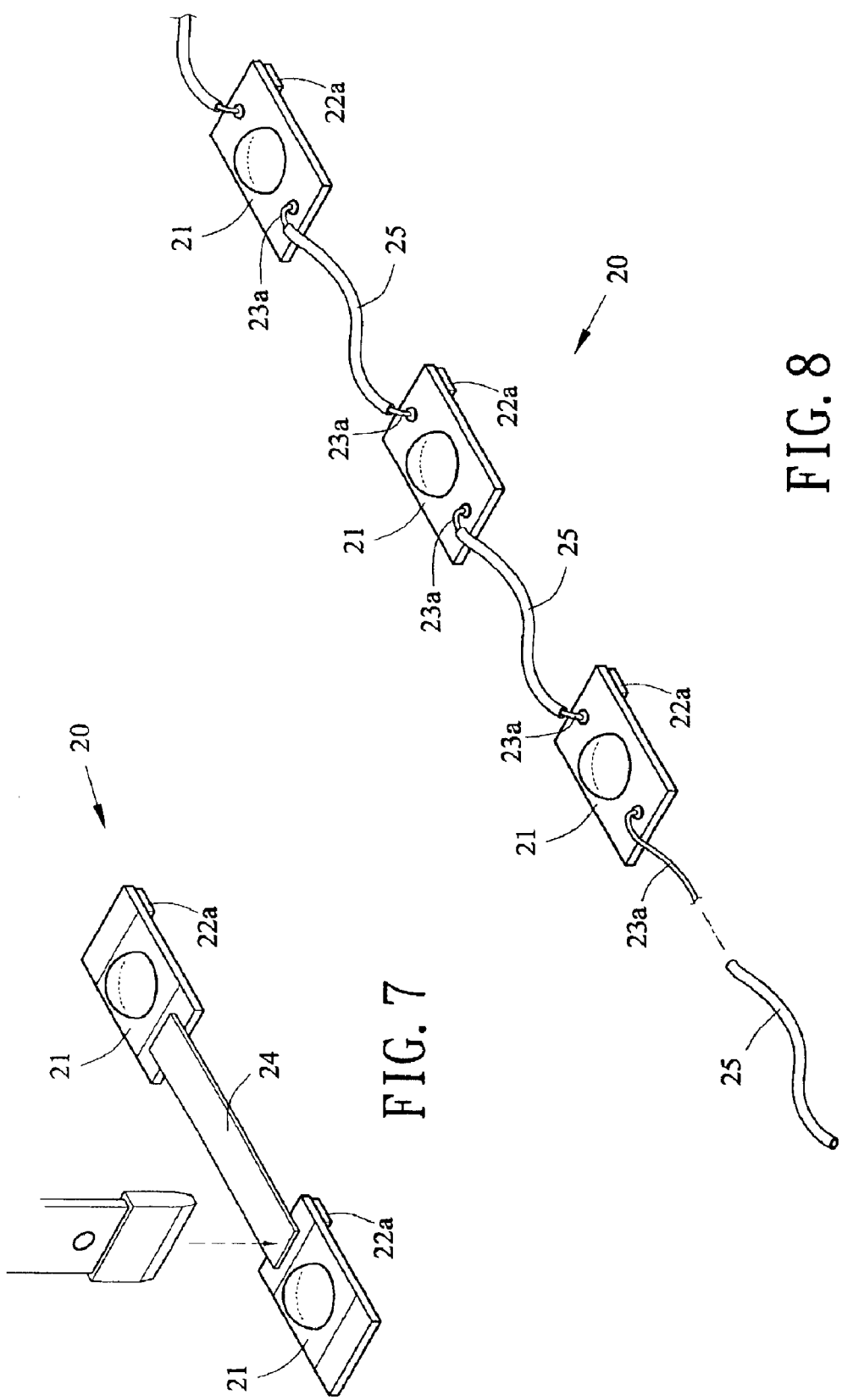

FLEXIBE ROD LIGHT DEVICE FORMED OF CHIP ON BOARD BASED LED LAMPS AND MANUFACTURING METHOD THEREOF

BACKGROUND OF THE INVENTION

1. Field of the Invention

The present invention relates to LED (Light Emitting Diode) means and more particularly to a flexible rod light device containing a string of chip on board (C.O.B.) based LED lamps and manufacturing method thereof.

2. Description of Related Art

A process of manufacturing a conventional flexible rod light is shown in FIG. 13. First, solder a terminal 2a of a LED lamp 2 to one end of a conductor section 3. Next, pull the conductor section 3 to pass a side of the LED lamp 2. Then, solder a terminal 2b of a second LED lamp 2 to the other end of the conductor section 3. Then, repeat above three processes to form a string of LED lamps. Next, put a continuous sleeve 1 around the string of LED lamps. Then, wrapping the sleeve 1 with a plastic material (not shown) by extrusion to form a jacket. As a result, the flexible rod light is formed.

However, the prior art suffered from several disadvantages. For example, there is no support means between any two adjacent LED lamps 2 with the conductor section 3 bent therebetween. Further, the LED lamps 2 and the conductor sections 3 tend to be stuck within the sleeve 1 during the manufacturing process. This is particularly true when the sleeve 1 has a length longer than a predetermined one, resulting in an interrupt of the manufacturing process. In a less serious case, a distance between two adjacent LED lamps 2 may be different from that of another two adjacent LED lamps 2. And in turn, the already bent conductor section 3 is further bent or extended. As an end, a desired configuration of equal spaced apart LED lamps 2 is not obtainable. Consequently, a uniform light emitted from the light device is made impossible. Furthermore, an excessive pulling of one LED lamp 2 from an adjacent LED lamp 2 may break the conductor section 3, thus disconnecting the electrical connection of the light device. Also, LED lamps 2 tend to displace slightly in the sleeve 1, i.e., not reliably secured. As such, light emitted from a displaced LED lamp 2 may not concentrate in a direction parallel to, for example, X-Z plane, i.e., being oblique relative to the X-Z plane.

Thus, it is desirable to provide an improved flexible rod light device formed of C.O.B. based LED lamps and manufacturing method thereof in order to overcome the above drawbacks of the prior art.

SUMMARY OF THE INVENTION

It is an object of the present invention to provide a flexible rod light device wherein light emitted from LED lamps can concentrate in a direction perpendicular to the top surface thereof to thereby increase illumination.

It is another object of the present invention to provide a flexible rod light device wherein a string of LED lamps enhances flexibility of the conductor section when used.

It is further object of the present invention to provide a flexible rod light device wherein the components of LED lamps and resistors are protected from damage.

It is still further object of the present invention to provide a flexible rod light device wherein the LED lamps are readily fastened and installed when assembling, and each of lamps has a same orientation.

It is still further object of the present invention to provide a flexible rod light device wherein a string of LED lamps and resistors is easily installed due to flat top and bottom surface of jacket.

In an aspect of the present invention to provide a flexible rod light device having concentrated light and increased flexibility to withstand a pulling thereof. The light device comprises a flexible elongate plate-shaped inner layer formed of a transparent or half-transparent plastic material including two parallel upward flanges on sides and a lengthwise top groove between the flanges; a string of C.O.B. based LED lamps comprising a plurality of series connected units each including a C.O.B. based LED lamp, two conductor sections coupled to opposite ends of the C.O.B. based LED lamp, and a resistor interconnecting the other conductor section of a unit and one conductor section of an adjacent unit so that the string of C.O.B. based LED lamps are secured on the groove by clinging between the flanges; a pair of main wires disposed within the flanges wherein front most and rearmost conductor sections are rested on the main wires in front and rear sides of the inner layer respectively; and a jacket, formed of the same material as the inner layer, wrapped up the inner layer and the string of C.O.B. based LED lamps.

In another aspect of the present invention to provide a method of manufacturing a flexible rod light device having concentrated light and increased flexibility to withstand a pulling thereof, the method comprising the steps of (a) wrapping a parallel pair of main wires in sides of an inner layer formed of a flexible elongate plastic material by molding wherein the inner layer includes two parallel upward flanges on the sides and a lengthwise top groove between the flanges; (b) soldering one end of a resistor to the other end of one conductor section and the other end thereof to one end of another adjacent conductor section, and interconnecting the conductor sections by an C.O.B. based LED lamp by soldering; (c) continuing step (b) to form a string of C.O.B based LED lamps including a plurality of units each including the C.O.B. based LED lamp, two conductor sections, and the resistor; (d) placing the string of C.O.B. based LED lamps on the groove and securing the same between the flanges; (e) disposing front most and rearmost conductor sections on the main wire in front and rear sides of the inner layer respectively; and (f) wrapping up the inner layer and the string of C.O.B. based LED lamps by a material the same as the inner layer by extruding to form a jacket.

The above and other objects, features and advantages of the present invention will become apparent from the following detailed description taken with the accompanying drawings.

BRIEF DESCRIPTION OF THE DRAWINGS

FIG. 7 is a perspective view of a portion of a string of C.O.B. based LED lamps according to a third preferred embodiment of flexible rod light device of the invention;

FIG. 8 is a perspective view of a portion of a string of C.O.B. based LED lamps according to a fourth preferred embodiment of flexible rod light device of the invention;

DETAILED DESCRIPTION OF THE PREFERRED EMBODIMENTS

Figure 1:
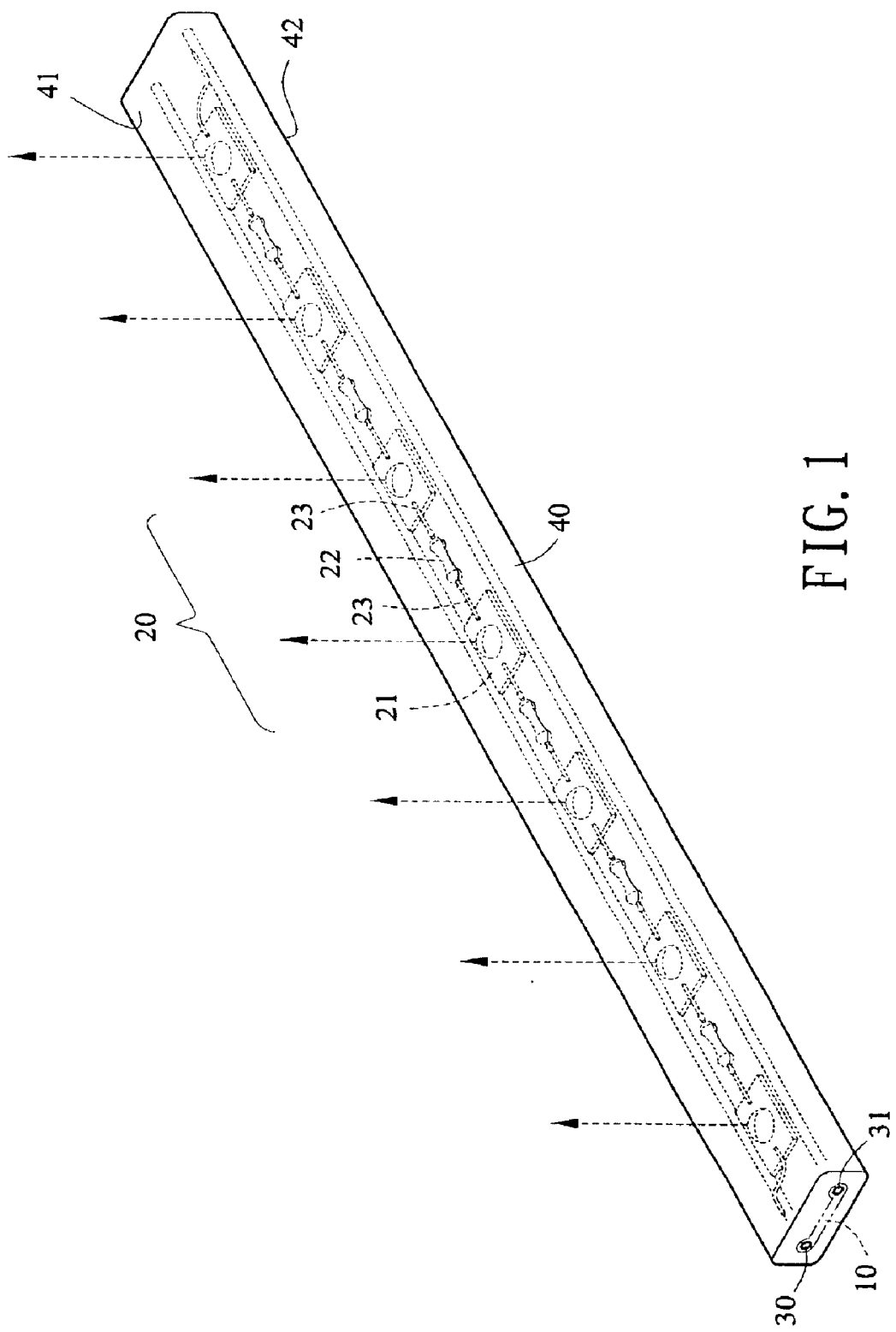
FIG. 1 is a perspective view of a first preferred embodiment of flexible rod light device according to the invention.
Figure 2:
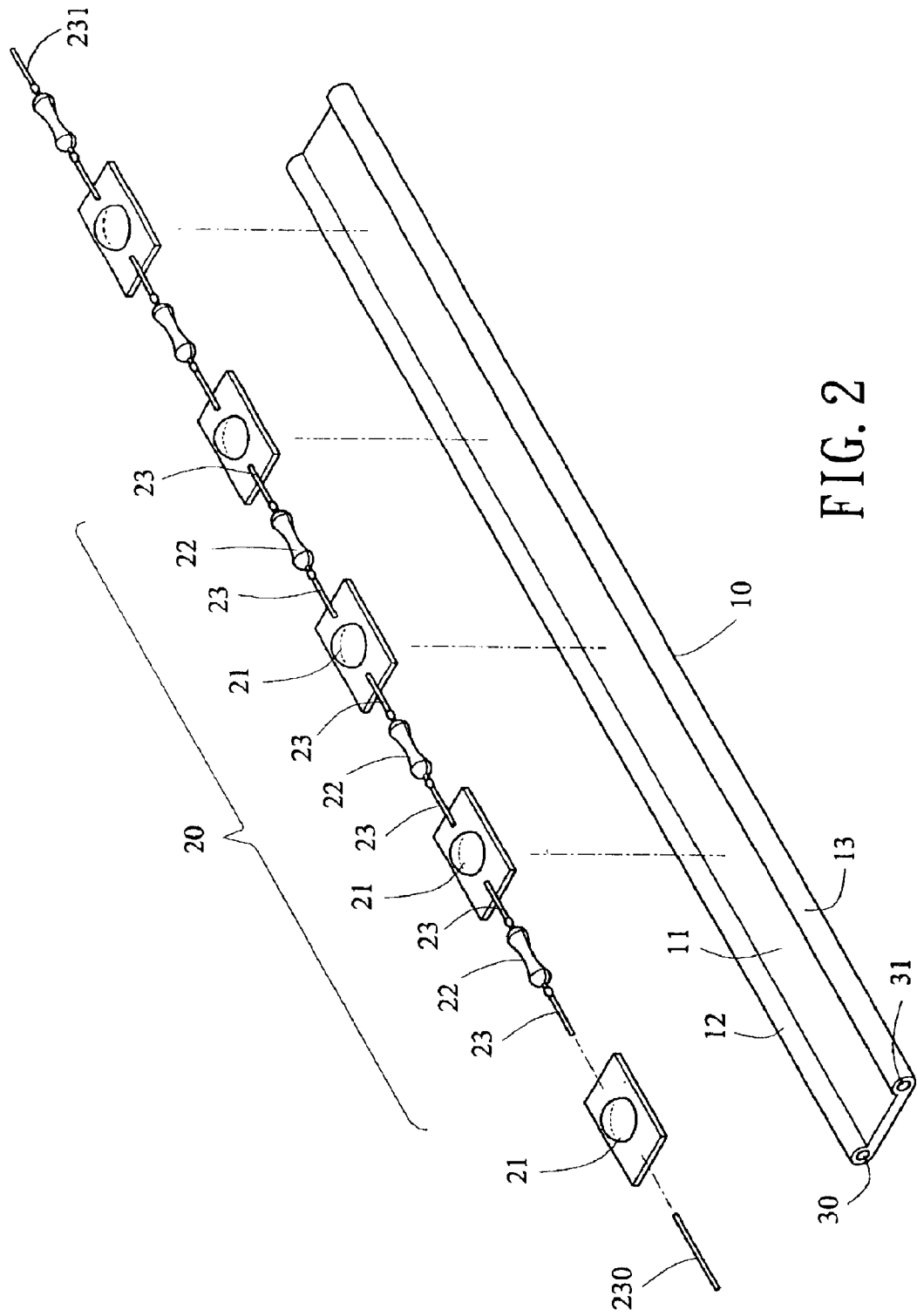
FIG. 2 is an exploded perspective view of a string of C.O.B. based LED lamps and an inner layer with a jacket removed for clarity according to the invention.
Figure 3:
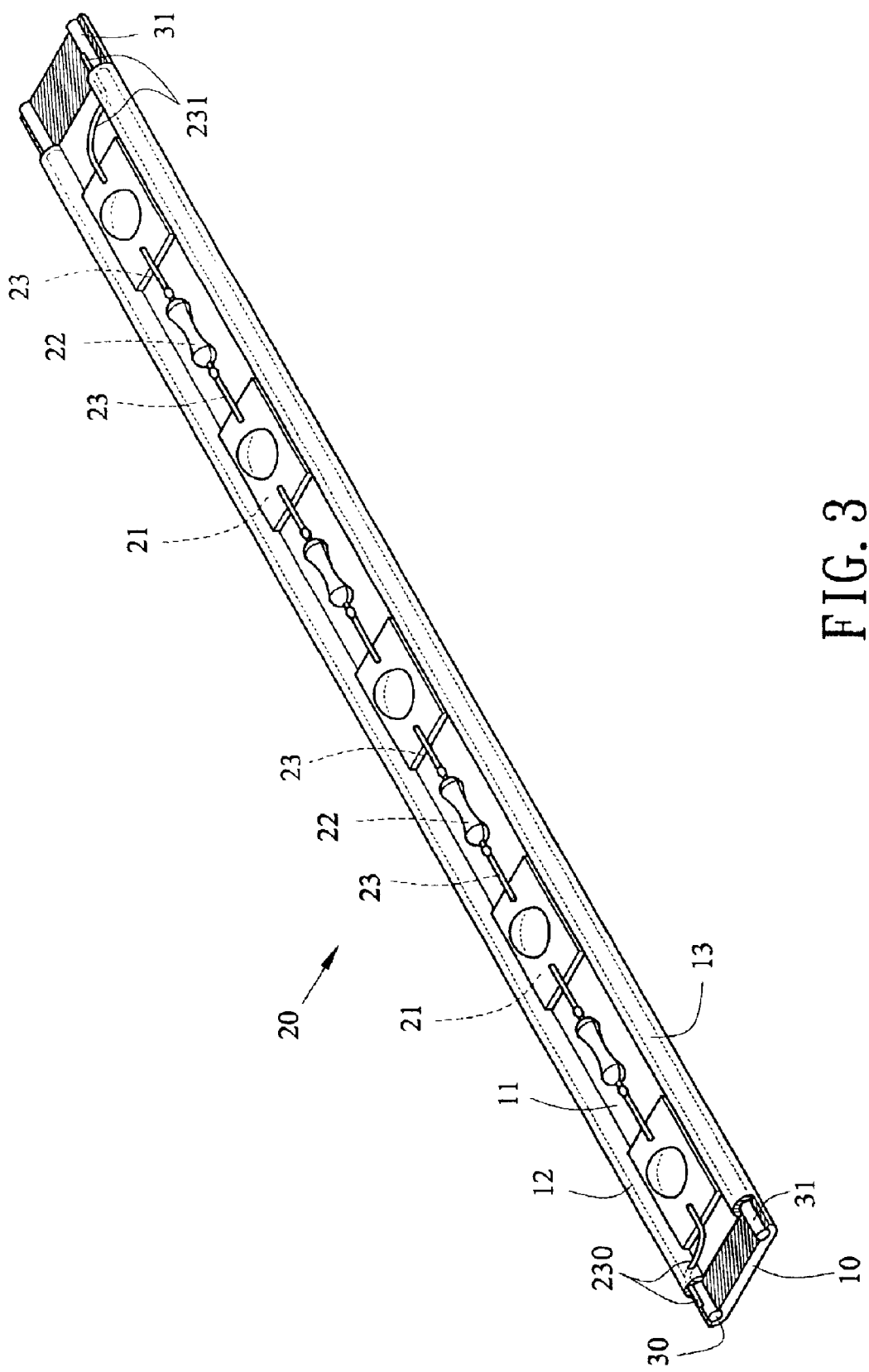
FIG. 3 is a perspective view in part section of the assembled string of C.O.B. based LED lamps and the inner layer according to the invention.

Referring to FIGS. 1, 2, 3, 4 and 5, there is shown a first preferred embodiment of flexible rod light device constructed in accordance with the invention. The light device comprises an inner layer 10, a string of C.O.B. based LED lamps 20, a pair of main wires 30 and 31, and a jacket 40. Each of above components will now be described in detail below. The inner layer 10 is a flexible elongate plate-shaped member formed of a transparent (or half-transparent) plastic material. The inner layer 10 comprises two parallel upward flanges 12 and 13 on both sides and a lengthwise top groove 11 between the flanges 12 and 13. The string of C.O.B. based LED lamps 20 comprises a plurality of units each including a C.O.B. based LED lamp 21 (i.e., C.O.B. based LED lamp 21 mounted on a board), two conductor sections 23 coupled to opposite ends of the C.O.B. based LED lamp 21 by soldering, and a resistor 22 interconnecting the other conductor section 23 of a unit and one conductor section 23 of an adjacent unit by soldering. With this configuration, C.O.B. based LED lamps 21 are series connected. Further, the string of C.O.B. based LED lamps 20 are secured on the groove 11 by clinging between the flanges 12 and 13. The pair of main wires 30 and 31 are disposed within the flanges 12 and 13. A front most conductor section 230 is disposed on the main wire 30 in a front side of the inner layer 10 by a tool. Likewise, a rearmost conductor section 231 is disposed on the main wire 31 in a rear side of the inner layer 10 by a tool. As such, the main wires 30 and 31 interconnect a power source (not shown) and the string of C.O.B. based LED lamps 20 to form an electric circuit. The jacket 40, having the same plastic material as the inner layer 10, is formed to wrap up the inner layer 10 and the string of C.O.B. based LED lamps 20 by extrusion.

Figure 4:
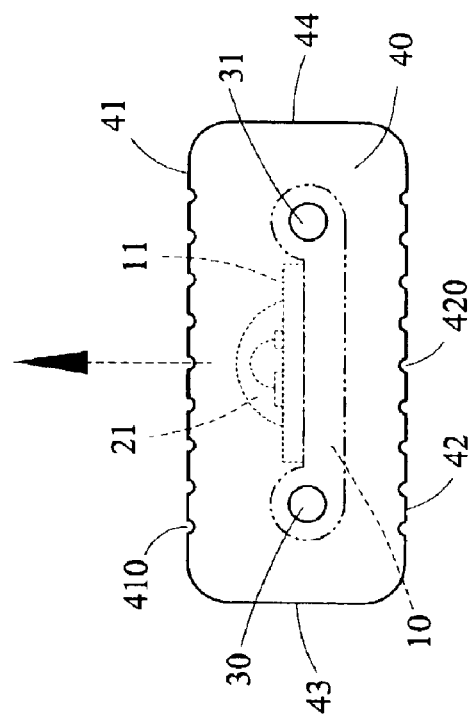
FIG. 4 is a side plan view of the light device.

Referring to FIG. 4 specifically, there is shown a side plan view of the light device of the present invention. A smoothness of flat top and bottom surface 41 and 42 of the jacket 40 can be seen clearly. Also, light emitted from the C.O.B. based LED lamp 21 (as indicated by arrow) concentrates in a direction perpendicular to the top surface 41, thus obtaining an increased illumination.

Figure 5:
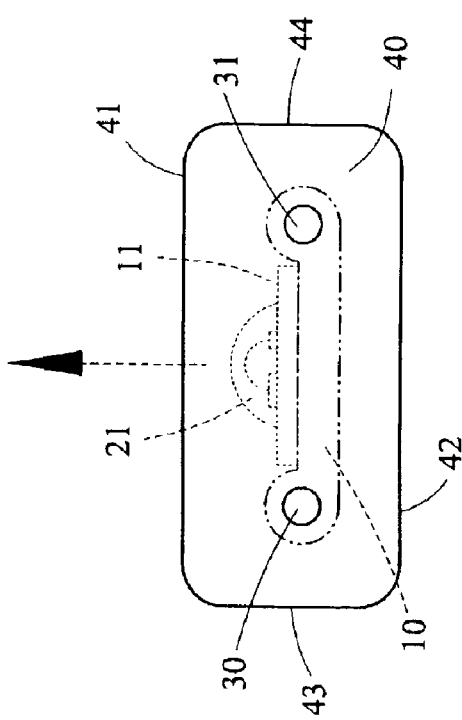
FIG. 5 is a view similar to FIG. 4, showing another embodiment of the jacket.

Referring to FIG. 5 specifically, there is shown another embodiment of the jacket 40 of the present invention wherein a plurality of parallel troughs 410 and 420 are formed on the top and bottom surfaces 41 and 42 respectively.

A process of manufacturing the flexible rod light device of the invention comprises the steps of:

Step 1: Wrap the parallel pair of main wires 30 and 31 in the sides of the inner layer 10 by molding.

Step 2: Solder one end of the resistor 22 to the other end of one conductor section 23 and solder the other end thereof to one end of another adjacent conductor section 23. Interconnect the conductor sections 23 of the same unit by the C.O.B. based LED lamp 21 by soldering. Continue above two sub-steps to form a string of C.O.B. based LED lamps 20 including a plurality of units each including the C.O.B. based LED lamp 21, two conductor sections 23, and the resistor 22.

Step 3: Place the string of C.O.B. based LED lamps 20 on the groove 11 and secure the same between the flanges 12 and 13.

Step 4: Dispose the front most and the rearmost conductor sections 230 on the main wire 30 in the front and rear sides of the inner layer 10 respectively by a tool. As such, the main wires 30 and 31 interconnect a power source (not shown) and the string of C.O.B. based LED lamps 20 to form an electric circuit.

Step 5: Wrap up the inner layer 10 and the string of C.O.B. based LED lamps 20 by a plastic material the same as the inner layer 10 by extruding to form a jacket 40.

The benefits of this invention include: The C.O.B. based LED lamps 21 are fastened and have the same orientation. Enhanced flexibility of the conductor sections 23 on the groove 11 (i.e., X-Y plane as assumed) to withstand a pulling of the light device. Protection the resistors 22 against damage. Easy installation is effected due to the flat top and bottom surfaces 41 and 42 of the jacket 40. Light emitted from C.O.B. based LED lamps 21 (as indicated by arrow) can concentrate in a direction perpendicular to the top surface 41, i.e., increased illumination.

Figure 6:
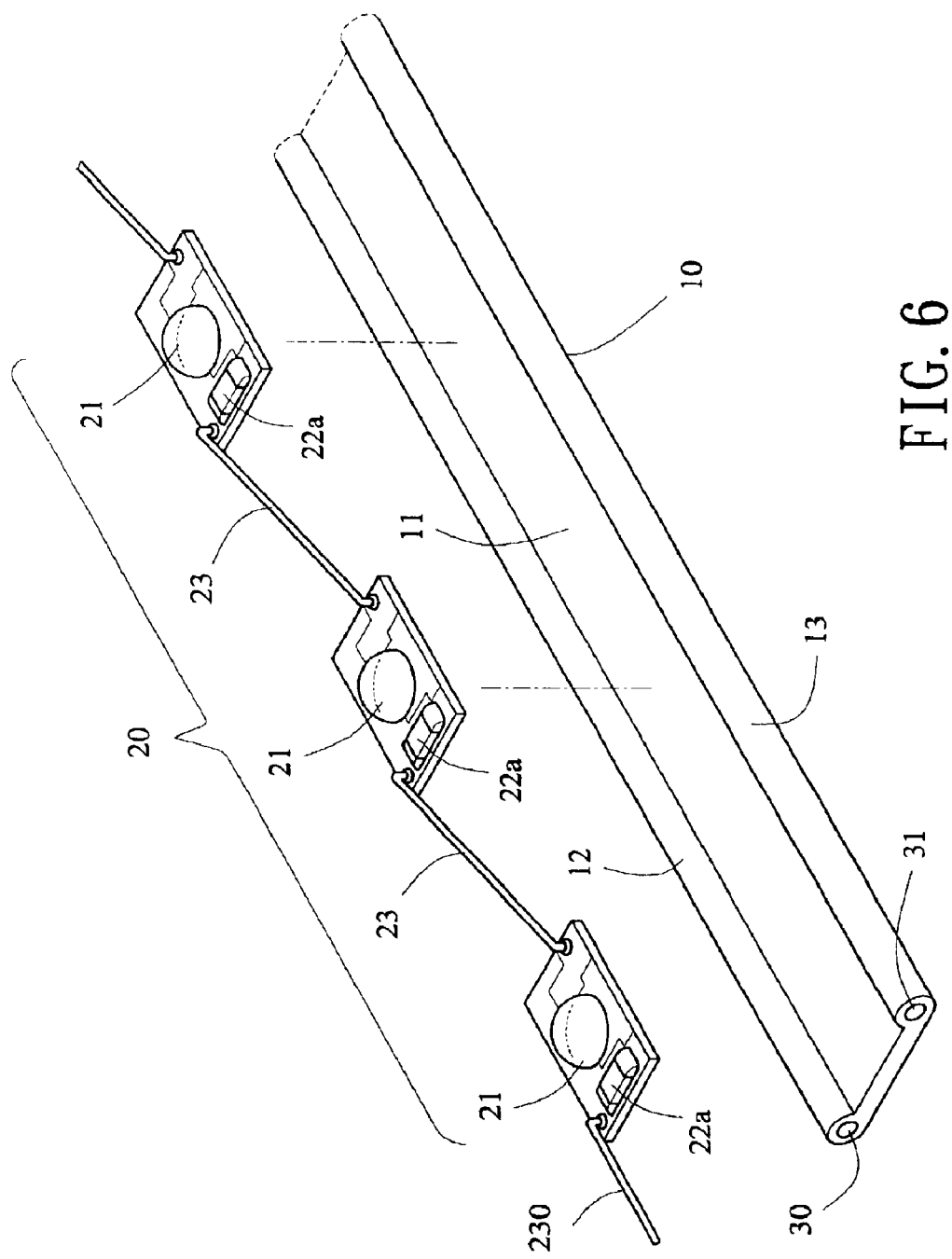
FIG. 6 is an exploded perspective view of a string of C.O.B. based LED lamps and an inner layer with a jacket removed for clarity according to a second preferred embodiment of flexible rod light device of the invention.

Referring to FIG. 6, there is shown a second preferred embodiment of the invention. The characteristics of the embodiment are detailed below. Each unit comprises a C.O.B. based LED lamp 21, a SMD resistor (or current control IC) 22a mounted on the C.O.B. based LED lamp 21 by soldering, and a conductor section 23 coupled between the C.O.B. based LED lamps 21 of two adjacent units by soldering. It is to be noted that above step 2 may be slightly adjusted as the following: Form each unit of the string of C.O.B. based LED lamps 20 by passing through a soldering paste or by spot welding on a section of wire of copper foil.

Referring to FIG. 7, there is shown a third preferred embodiment of the invention. The characteristics of the embodiment are detailed below. An elongate copper foil section 24 is used to replace the conductor section for interconnecting the C.O.B. based LED lamps 21 of two adjacent units by soldering. Further, SMD resistor (or current control IC) 22a is mounted on a bottom of the C.O.B. based LED lamp 21.

Referring to FIG. 8, there is shown a fourth preferred embodiment of the invention. The difference of the third and the fourth embodiments is that the elongate copper foil section 24 is replaced by a conductor section 23a and a flexible sleeve 25 is sleeved on the conductor section 23a. As such, a benefit of permitting a pulling of the sleeve 25 without disengaging the conductor section 23a from the adjacent C.O.B. based LED lamp 21 is obtained. In other words, an enhanced flexibility of the conductor section is achieved.

Figure 9:
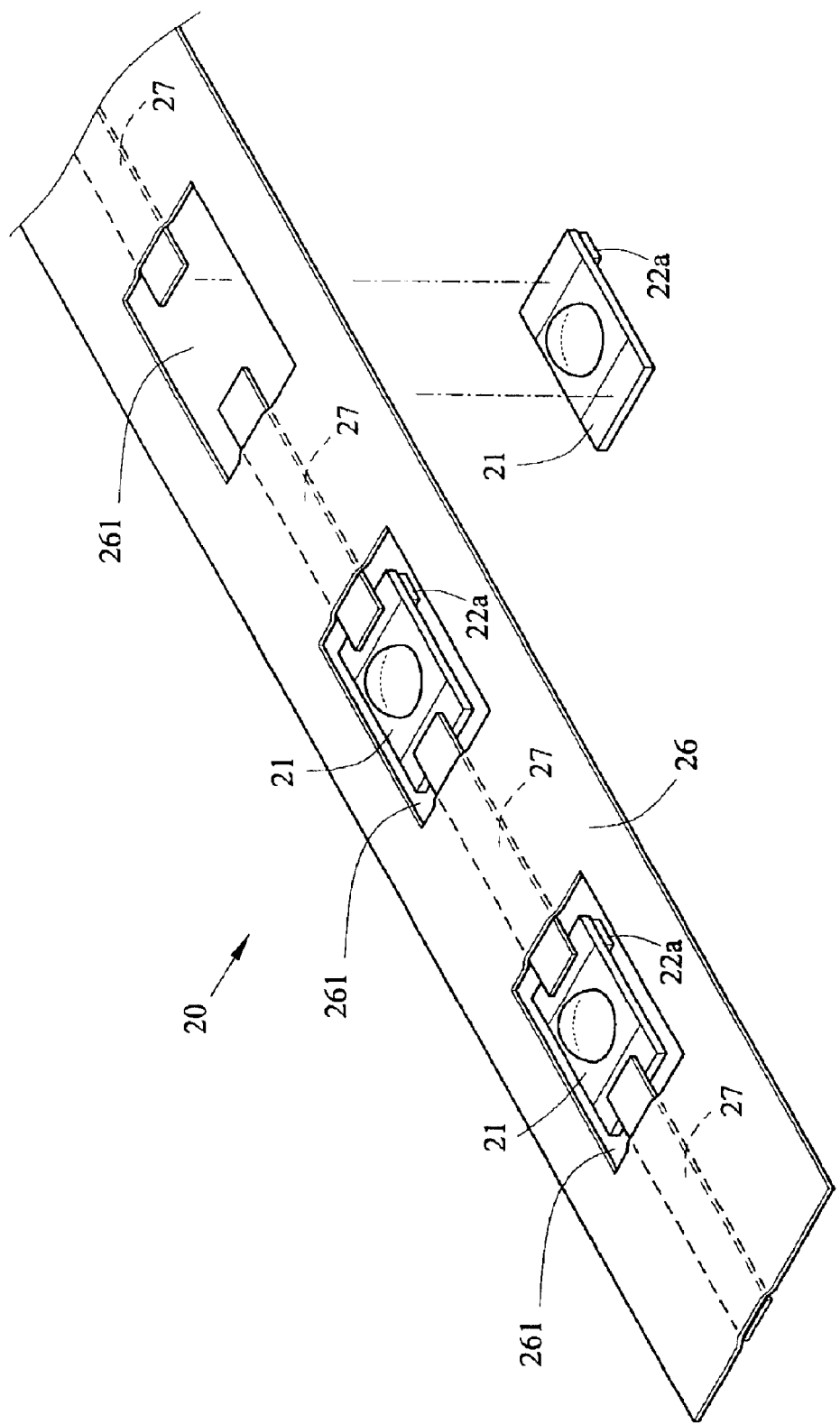
FIG. 9 is a perspective view of a portion of a string of C.O.B. based LED lamps according to a fifth preferred embodiment of flexible rod light device of the invention.

Referring to FIG. 9, there is shown a fifth preferred embodiment of the invention. The differences of the third and the fifth embodiments are that the elongate copper foil section 24 is replaced by an elongate metal foil section 27. Further, a temporary tape 26 having a plurality of equally spaced apart rectangular openings 261 (formed by punching) each sized for positioning the C.O.B. based LED lamp 21 and small portions of the elongate metal foil sections 27 therein is provided. The tape 26 is removed once the string of C.O.B. based LED lamps 20 has been secured on the groove 11. Note that the coupling of the C.O.B. based LED lamp 21 and the elongate metal foil sections 27 may be effected by means of a solder machine having a plurality of soldering means for simultaneous soldering.

Figure 10:
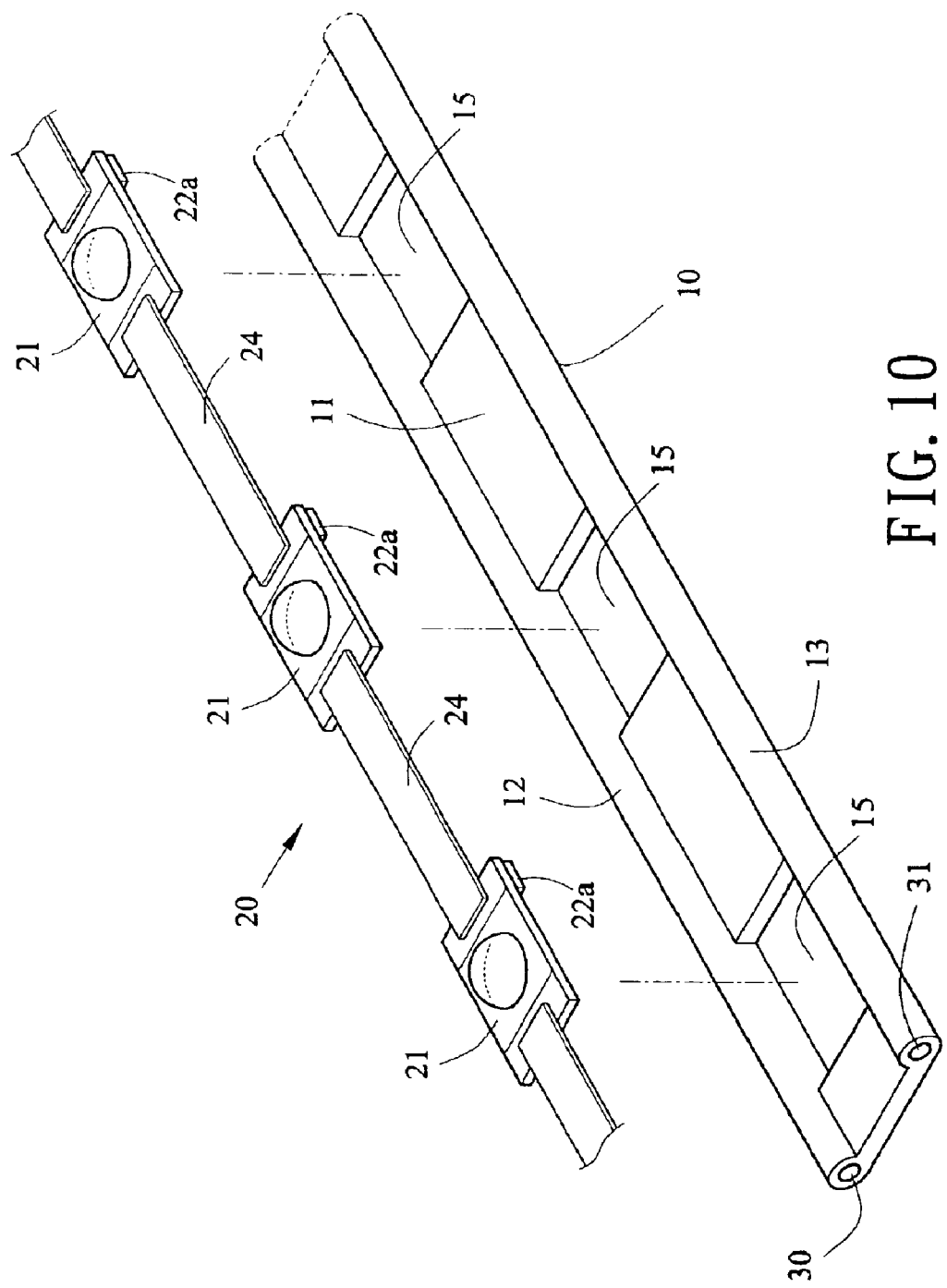
FIG. 10 is an exploded perspective view of a string of C.O.B. based LED lamps and an inner layer with a jacket removed for clarity according to a sixth preferred embodiment of flexible rod light device of the invention.

Referring to FIG. 10, there is shown a sixth preferred embodiment of the invention. The differences of the third and the sixth embodiments are that a plurality of equally spaced apart rectangular recesses 15 are formed on the groove 11 by punching wherein each recess 15 is sized to receive and secure the C.O.B. based LED lamp 21 therein. Note that, in one case, a plurality of bubbles are formed on top of each recess 15 by controlling extrusion temperature and extrusion speed of the jacket. As such, a flexibility of the light device is made possible because the bubbles can provide a buffering effect between the recess 15 and the C.O.B. based LED lamp 21 when the light device is bent. Further note that, in another case, there are no bubbles formed. Instead, a plurality of raised points are formed on top of each recess 15. The raised points also can provide a buffering effect between the recess 15 and the C.O.B. based LED lamp 21 when the light device is bent.

Figure 11:
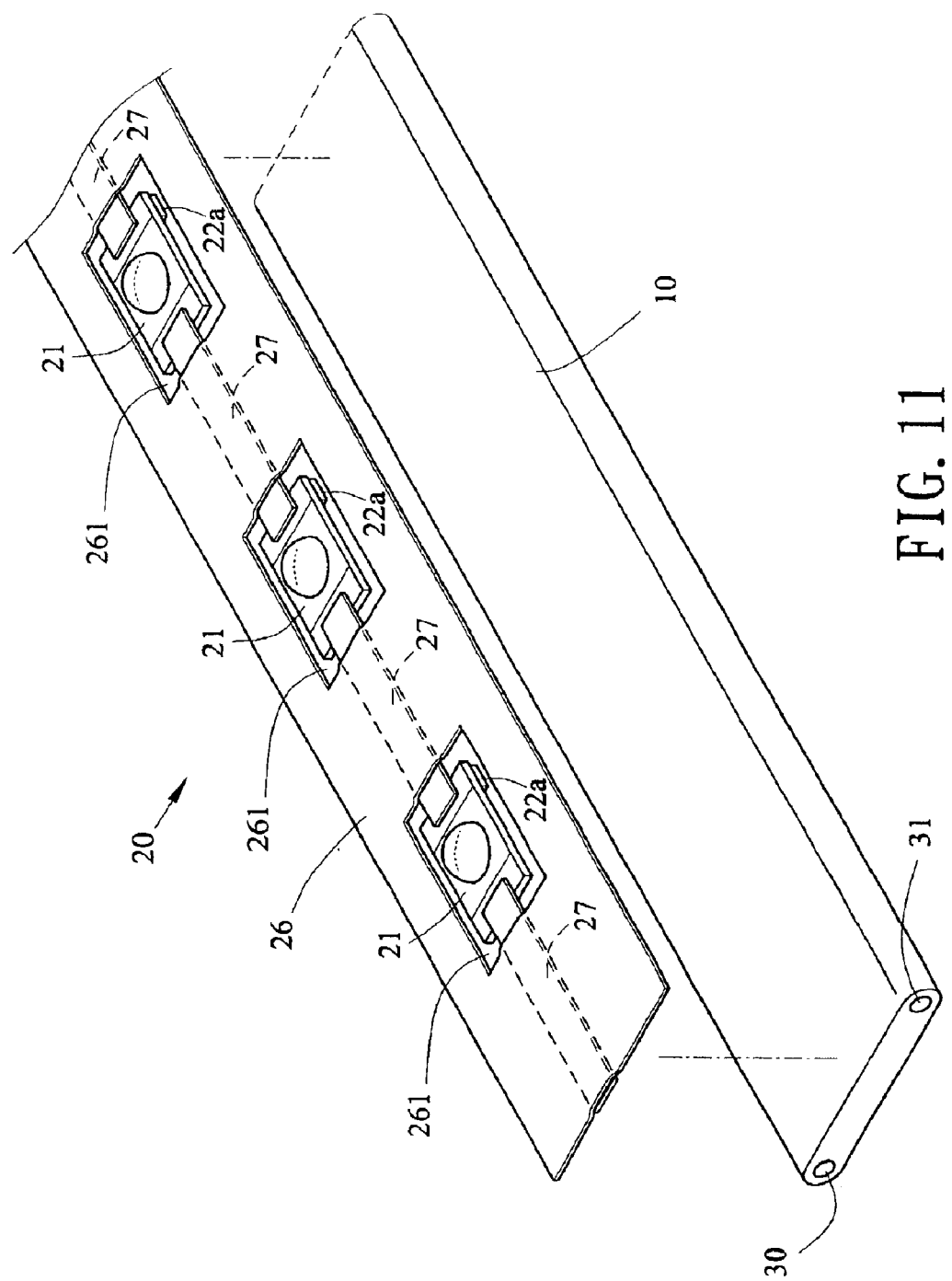
FIG. 11 is an exploded perspective view of a string of C.O.B. based LED lamps and an inner layer with a jacket removed for clarity according to a seventh preferred embodiment of flexible rod light device of the invention.

Referring to FIG. 11, there is shown a seventh preferred embodiment of the invention. The difference of the fifth and the seventh embodiments is that the tape 26 is secured on top of the inner layer 10 by means of adhesive. Such also can achieve the purpose of positioning and securing the string of C.O.B. based LED lamps 20 on the inner layer 10.

Figure 12:
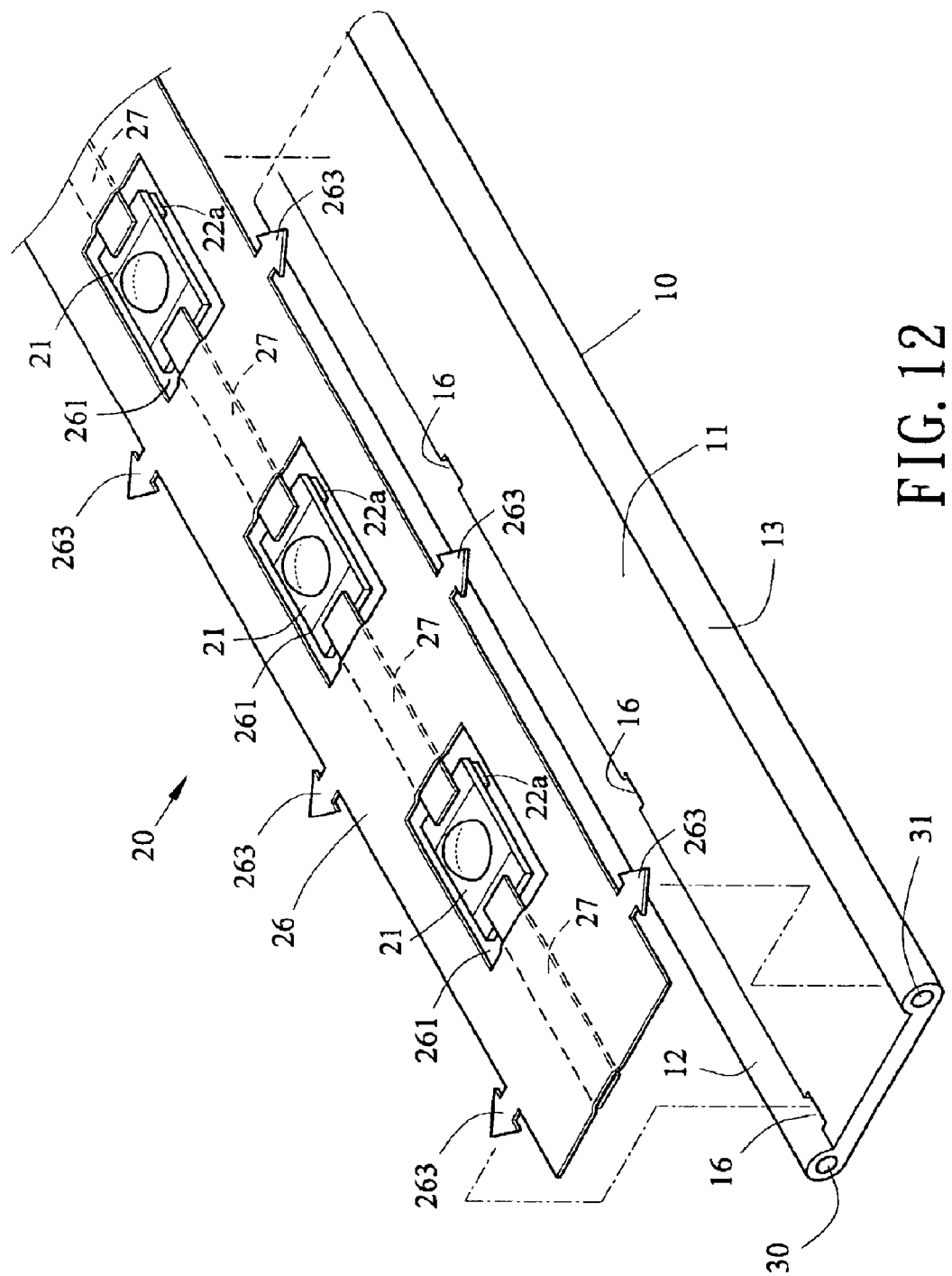
FIG. 12 is an exploded perspective view of a string of C.O.B. based LED lamps and an inner layer with a jacket removed for clarity according to an eighth preferred embodiment of flexible rod light device of the invention.
Figure 13:
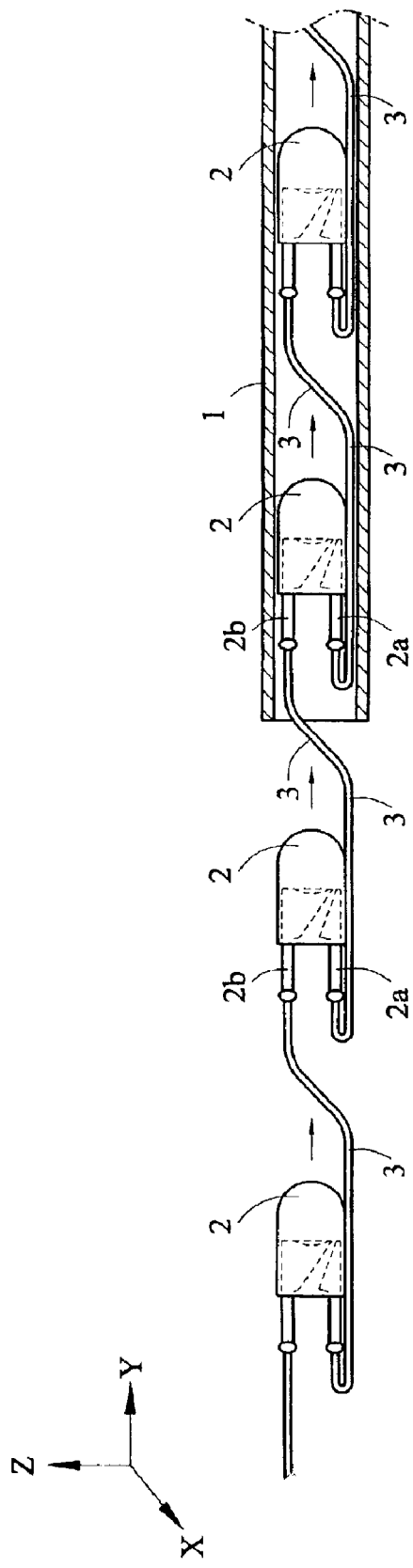
FIG. 13 is a side view in part section for illustrating a process of manufacturing a conventional flexible rod light.

Referring to FIG. 12, there is shown an eighth preferred embodiment of the invention. The difference of the seventh and the eighth embodiments are that a plurality of equally spaced apart slots 16 are formed on either side of the groove 11 abutted on the flanges 12 and 13 and a plurality of equally spaced apart latched members 263 are formed on either side of the string of C.O.B. based LED lamps 20 wherein each latched member 263 is inserted into and secure in each corresponding slot 16.

Also, side surfaces 43 and 44 of the jacket 40 can be made flat. Thus, a substantially rectangular or square cross-section of the light is obtained.

While the invention herein disclosed has been described by means of specific embodiments, numerous modifications and variations could be made thereto by those skilled in the art without departing from the scope and spirit of the invention set forth in the claims.

What is claimed is:

1. A flexible rod light device having concentrated light and increased flexibility to withstand a pulling thereof, the light device comprising:
 a flexible elongate plate-shaped inner layer formed of a transparent or half-transparent plastic material including two parallel upward flanges on sides and a lengthwise top groove between the flanges;
 a string of C.O.B. (chip on board) based LED lamps comprising a plurality of series connected units each of the units including a C.O.B. based LED lamp, a first conductor section and a second conductor section coupled to a first end and a second end of the C.O.B. based LED lamp, respectively, and a first resistor interconnecting the first conductor section of a unit and the second conductor section of an adjacent unit so that the string of C.O.B. based LED lamps are secured on the groove by clinging between the flanges;
 a pair of main wires disposed within the flanges wherein a front most and a rearmost conductor sections of the string of the C.O.B. based LED lamps are rested on the main wires in a front and a rear sides of the inner layer respectively; and
 a jacket, formed of the same material as the inner layer, wrapped up the inner layer and the string of C.O.B. based LED lamps.

2. The device of claim 1, wherein the jacket has flat top and bottom surfaces so that light emitted from the C.O.B. based LED lamps is concentrated in a direction perpendicular to the top surface.

3. The device of claim 2, further comprising a plurality of parallel troughs formed on the top and the bottom surfaces of the jacket respectively.

4. The device of claim 1, wherein the jacket has a substantially rectangular cross-section.

5. A flexible rod light device comprising:
 a flexible elongate plate-shaped inner layer formed of a transparent or half-transparent plastic material including two parallel upward flanges on sides and a lengthwise top groove between the flanges;
 a string of C.O.B. (chip on board) based LED lamps comprising a plurality of series connected units each of the units including a C.O.B. based LED lamp, and a resistor mounted on the C.O.B. based LED lamp, a conductor section coupled between the C.O.B. based LED lamps of two adjacent units so that the string of C.O.B. based LED lamps are secured on the groove by clinging between the flanges;
 a pair of main wires disposed within the flanges wherein a front most and a rearmost conductor sections of the string of the C.O.B. based LED lamps are rested on the main wires in a front and a rear sides of the inner layer respectively; and
 a jacket, formed of the same material as the inner layer, wrapped up the inner layer and the string of C.O.B. based LED lamps.

6. The device of claim 5, wherein the resistor is a SMD resistor.

7. The device of claim 5, wherein the resistor is a current control IC resistor.

8. The device of claim 5, wherein said conductor section is an elongate copper foil section coupled between the C.O.B. based LED lamps of two adjacent units wherein the resistor is mounted on a bottom of the C.O.B. based LED lamp.

9. The device of claim 8, wherein the resistor is a SMD resistor.

10. The device of claim 8, wherein the resistor is a current control IC resistor.

11. The device of claim 5, wherein the a second resistor is mounted on a bottom of the C.O.B. based LED lamp, and a flexible sleeve sleeved on the conductor section for enhancing a flexibility of the conductor section.

12. The device of claim 11, wherein the resistor is a SMD resistor.

13. The device of claim 11, wherein the resistor is a current control IC resistor.

14. The device of claim 5, wherein the resistor is mounted on a bottom of the C.O.B. based LED lamp, the conductor section is an elongate metal foil section coupled between the C.O.B. based LED lamps of two adjacent units, and a tape having a plurality of equally spaced apart openings each sized for positioning the C.O.B. based LED lamp and portions of the elongate metal foil sections therein, the tape being removed once the string of C.O.B. based LED lamps has been secured on the groove.

15. The device of claim 14, wherein the resistor is a SMD resistor.

16. The device of claim 14, wherein the resistor is a current control IC resistor.

17. The device of claim 14, wherein the tape is secured on a top of the inner layer by means of an adhesive.

18. The device of claim 5, further comprising a plurality of equally spaced apart slots on either side of the groove abutted on the flange and a tape having a plurality of equally spaced apart latched members on either side of the string of C.O.B. based LED lamps wherein each latched member is inserted into and secured in the corresponding slot.

19. The device of claim 5, further comprising a plurality of equally spaced apart rectangular recesses on the groove formed by punching wherein each recess is sized to receive and secure the C.O.B. based LED lamp therein.

20. The device of claim 19, further comprising a plurality of bubbles on a top of each recess formed by controlling an extrusion temperature and an extrusion speed of the jacket.

* * * * *